(12) United States Patent
Yan et al.

(10) Patent No.: US 9,490,366 B2
(45) Date of Patent: Nov. 8, 2016

(54) THIN FILM TRANSISTOR, AMORPHOUS SILICON FLAT DETECTION SUBSTRATE AND MANUFACTURING METHOD

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Changjiang Yan, Beijing (CN); Jun Long, Beijing (CN); Zongmin Tian, Beijing (CN); Zhenyu Xie, Beijing (CN); Xu Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 56 days.

(21) Appl. No.: 14/354,204

(22) PCT Filed: Jun. 20, 2013

(86) PCT No.: PCT/CN2013/077592
§ 371 (c)(1),
(2) Date: Apr. 25, 2014

(87) PCT Pub. No.: WO2014/153871
PCT Pub. Date: Oct. 2, 2014

(65) Prior Publication Data
US 2015/0340511 A1 Nov. 26, 2015

(30) Foreign Application Priority Data
Mar. 28, 2013 (CN) .......................... 2013 1 0105564

(51) Int. Cl.
| H01L 29/786 | (2006.01) |
| H01L 27/146 | (2006.01) |
| H01L 29/66 | (2006.01) |
| H01L 27/12 | (2006.01) |

(52) U.S. Cl.
CPC ..... *H01L 29/78618* (2013.01); *H01L 27/1225* (2013.01); *H01L 27/14623* (2013.01); *H01L 27/14663* (2013.01); *H01L 29/66969* (2013.01); *H01L 29/78693* (2013.01)

(58) Field of Classification Search
CPC .......... H01L 27/1214; H01L 27/1251; H01L 27/3274; H01L 29/4908; H01L 51/0508; H01L 29/78618; H01L 27/14663; H01L 27/1225
USPC ................. 257/21, 40, 53, 79, 88, 184, 228; 438/85, 104, 116
See application file for complete search history.

(56) References Cited

U.S. PATENT DOCUMENTS

2006/0108587 A1* 5/2006 Lee ..................... G02F 1/13439
257/72
2008/0303020 A1 12/2008 Shin et al.
(Continued)

FOREIGN PATENT DOCUMENTS

| CN | 102468306 A | 5/2012 |
| CN | 102629577 A | 8/2012 |

(Continued)

OTHER PUBLICATIONS

Kenji Nomura, et al; "Room-temperature fabrication of transparent flexible thin-film transistors using amorphous oxide semiconductors", Nature, vol. 432, Nov. 23, 2004, pp. 488-491.
(Continued)

*Primary Examiner* — Jarrett Stark
*Assistant Examiner* — Shahed Ahmed
(74) *Attorney, Agent, or Firm* — Ladas & Parry LLP (57) ABSTRACT

A thin film transistor, an amorphous silicon flat detection substrate and a manufacturing method are provided. The material for a source electrode and a drain electrode of the thin film transistor is a conductor converted from the material for the amorphous metal oxide active layer by depositing an insulating substance containing hydrogen ions not less than a preset value, which reduces the valence band level difference between the source and the drain electrodes and the active layer, realizes good lattice matching and improves electricity characteristics of the thin film transistor.

19 Claims, 6 Drawing Sheets

(56) References Cited

U.S. PATENT DOCUMENTS

| | | | |
|---|---|---|---|
| 2012/0052636 A1 | 3/2012 | Shin et al. | |
| 2012/0104381 A1* | 5/2012 | Shieh | H01L 29/7869 257/43 |
| 2012/0242624 A1* | 9/2012 | Tomiyasu | G02F 1/136227 345/175 |
| 2014/0077160 A1 | 3/2014 | Dai et al. | |

FOREIGN PATENT DOCUMENTS

| | | |
|---|---|---|
| CN | 102629578 A | 8/2012 |
| CN | 202721128 U | 2/2013 |
| JP | 05-243270 A | 9/1993 |

OTHER PUBLICATIONS

Second Chinese Office Action dated Sep. 29, 2015; Appln. No. 201310105564.7.

International Preliminary Report on Patentability dated Sep. 29, 2015; PCT/CN2013/077592.

First Chinese Office Action dated Mar. 25, 2015; Appln. No. 201310105564.7.

International Search Report mailed Feb. 1, 2014; PCT/CN2013/077592.

Third Chinese Office Action dated Feb. 14, 2016; Appln No. 201310105564.7.

* cited by examiner

FIG. 4

THIN FILM TRANSISTOR, AMORPHOUS SILICON FLAT DETECTION SUBSTRATE AND MANUFACTURING METHOD

TECHNICAL FIELD

Embodiments of the present invention relate to a thin film transistor, an amorphous silicon detector substrate and a manufacturing method.

BACKGROUND

An amorphous silicon flat detection substrate is a device for converting X ray into electrical signals with a structure including a cesium iodide scintillation layer, amorphous selenium photoelectric conversion layer, and thin film transistors (TFT). A thin film transistor includes a source electrode, a drain electrode, a gate electrode, an active layer and a passivation layer, the source electrode and the drain electrode are directly connected with the active layer; the material for the source electrode and the drain electrode is a conductor, typically a metal; the material for the active layer is a semiconductor, typically amorphous silicon (a-Si), low temperature polysilicon (LTPS), amorphous metal oxide semiconductor (e.g., indium gallium zinc oxide (IGZO), indium zinc tin oxide (InZnSnO), indium zinc oxide (IZO)). A thin film transistor with amorphous metal oxide semiconductor as the active layer is generally called an oxide thin film transistor (Oxide TFT).

Figure 1:
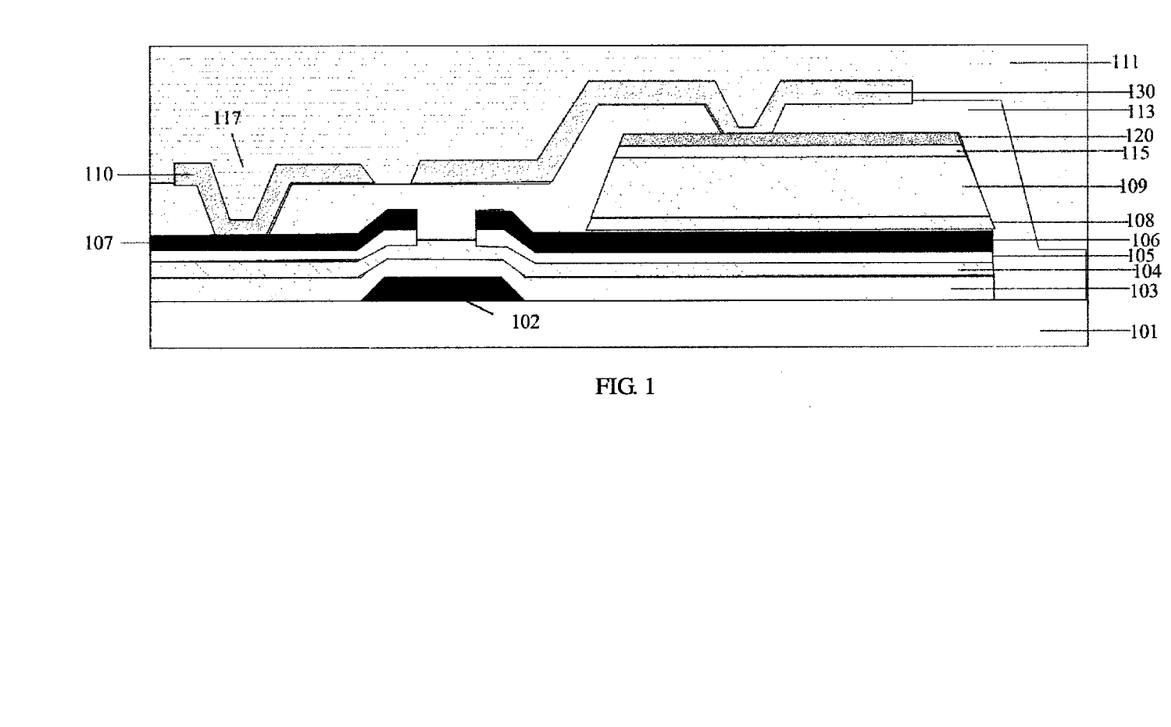
FIG. 1 is a structural view of a prior art thin film transistor.

As shown in FIG. 1, a structure of an amorphous silicon flat detection substrate includes: a glass substrate 101 as a base layer, a gate electrode 102 disposed on the glass substrate 101, a gate electrode insulating layer 103 deposited on the glass substrate 101 and the gate electrode 102, amorphous silicon 104 deposited on the gate electrode insulating layer 103, N-type semiconductor 105 deposited on the amorphous silicon 104, a metal drain electrode 106 and a metal source electrode 107 deposited on the N-type semiconductor 105, a photodiode (PIN junction) formed of a stack of P-type silicon 108, intrinsic silicon 109 and N-type semiconductor 115 and disposed on the metal drain electrode 106, and an electrode 120 disposed on the N-type semiconductor 115 of the PIN junction, an insulating layer 113 disposed on the electrode 120 and the metal source electrode 107, a pixel electrode 110 and a reverse biasing voltage cathode 130 disposed on the insulating layer 113, and a resin passivation layer 111 formed on the pixel electrode 110 for protecting the device. The pixel electrode 110 is electrically connected with the source electrode 107 through a via 117 formed in the insulating layer 120, and the reverse biasing voltage cathode 130 is electrically connected with the electrode 120 through a via.

The amorphous silicon 104 deposited on the gate electrode insulating layer 103 constitutes an amorphous silicon active layer; the electrodes are connected with the amorphous silicon active layer through the N-type semiconductor 105, and because the valence band energy level of the used the source electrode and the drain electrode 106 differs greatly from that of the amorphous silicon 104 of the active layer, and the lattice matching is not good, and this causes the formed heterojunction or homojunction remarkably influence the driving current signal, resulting in poor interface contact, hence influencing electricity characteristics of the thin film transistor.

It can be seen that the great difference between valence band levels of the source electrode and the drain electrode of a metal material and the active layer of an amorphous silicon material influence significantly the electricity characteristics of the thin film transistor.

SUMMARY

Embodiments of the present invention provide a thin film transistor, an amorphous silicon flat detection substrate and a manufacturing method to reduce influence of valence band level difference between source, drain electrode and active layer on the thin film transistor's electricity characteristic.

One aspect of the present invention provides a manufacturing method of a thin film transistor including steps of: disposing an amorphous metal oxide semiconductor film on a substrate or on a gate electrode insulating layer on a gate electrode; depositing an insulating substance containing hydrogen ions not less than a preset value in parts of the amorphous metal oxide semiconductor film serving as a source electrode and a drain electrode.

Another aspect of the present invention provides a manufacturing method of amorphous silicon flat detection substrate including the manufacturing method of the thin film transistor provided in an embodiment of the present invention.

Yet another aspect of the present invention provides a thin film transistor including: a source electrode, a drain electrode and an active layer connecting the source electrode and the drain electrode, the active layer being an amorphous metal oxide semiconductor layer; a material for the source electrode and the drain electrode is a conductor converted from the material of the active layer by depositing an insulating substance containing hydrogen ions not less than a preset value.

Yet another aspect of the present invention provides an amorphous silicon flat detection substrate including the thin film transistor provided in an embodiment of the present invention.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. The words "on," "under," "right," "left" and the like are only used to indicate relative position relationship, and when the position of the object which is described is changed, the relative position relationship may be changed accordingly.

Figure 2A:
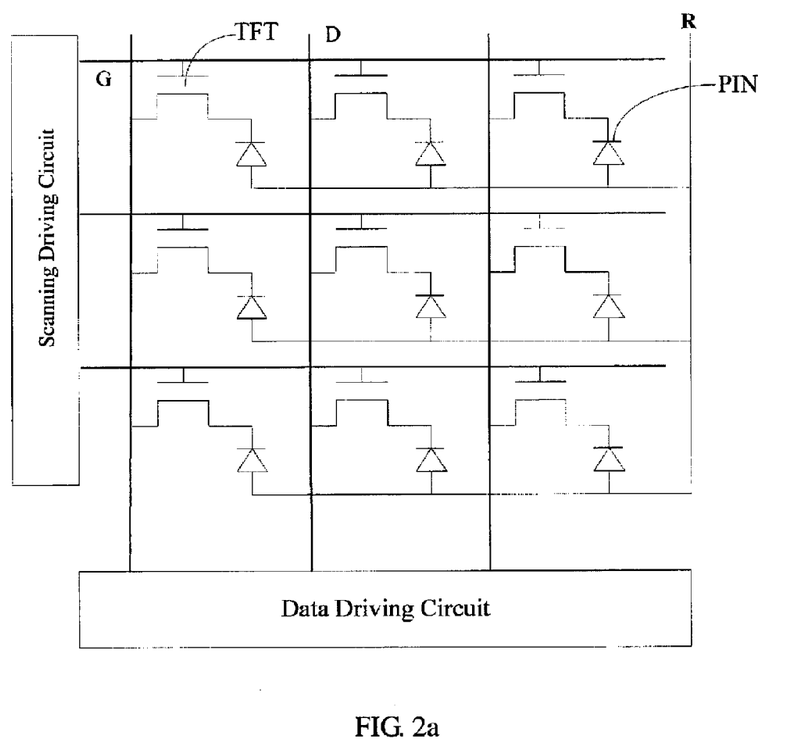
FIG. 2a is a circuit schematic diagram of a flat detection substrate provided in an embodiment of the present invention.

As shown in FIG. 2a, the flat detection substrate provided in an embodiment of the present invention includes a plurality of pixels arranged in an array, each pixel including a switch thin film transistor (TFT) and a light emitting diode (for example PIN structure). In the figure, the signal scanning line laterally connected to a scanning driving circuit is a gate line G; the signal scanning line longitudinally connected to a data driving circuit is a data line D; the horizontal signal line connected with one end of the photosensitive diode (PIN) is a reverse biasing voltage cathode that can be connected to a reverse biasing line R.

Figure 2B:
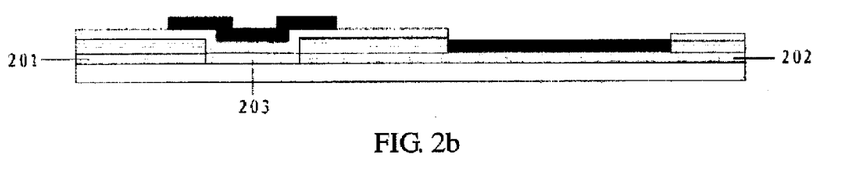
FIG. 2b is a structural view I of the thin film transistor provided in an embodiment of the present invention.

As shown in FIG. 2b, the thin film transistor in a pixel of the flat detection substrate in an embodiment of the present invention includes: a source electrode 201, a drain electrode 202, and an active layer 203 connecting the source electrode 201 and the drain electrode 202. The source electrode 201 and the drain electrode 202 face each other via the active layer 203, and their material is a conductor converted from the material of the active layer 203.

Since the material for the source electrode 201 and the drain electrode 202 is the conductor converted from the material of active layer 203, its valence band level differs little from the active layer 203, and the lattice matching is good, the heterojunction or homojunction formed between the source electrode 201 and the drain electrode 202 and the active layer 203 less influence the driving current signal. Thus, the interface contact performance is improved, and the influence of valence band level difference between source electrode and drain electrode and the active layer on electricity characteristics of the thin film transistor is decreased.

For example, the active layer 203 may be made of an amorphous metal oxide semiconductor, that is, the active layer 203 is an amorphous metal oxide semiconductor layer.

Since the amorphous metal oxide semiconductor has excellent performance such as high mobility, low pressure valve rate, small current and low temperature manufacturing, it is suitable for the active layer 203. However, the amorphous (non-crystalline) characteristics of the amorphous metal oxide semiconductor means lots of defect states in the semiconductor. When vast hydrogen ions contact the amorphous metal oxide, hydrogen ions are filled in the amorphous metal oxide as carriers to form a conductor due to the defect states of the amorphous metal oxide.

The amorphous metal oxide semiconductor may be indium gallium zinc oxide (IGZO) semiconductor, indium tin oxide (ITO) semiconductor, or indium zinc oxide (IZO) semiconductor.

For example, an embodiment of the present invention provides a method for converting parts of the amorphous metal oxide semiconductor film for serving as the source electrode and the drain electrode into a conductor by depositing an insulating substance containing hydrogen ions not less than a preset value, including: coating photoresist on the amorphous metal oxide semiconductor film, removing photoresist on parts of the amorphous metal oxide semiconductor film that will serve as source electrode and drain electrode, and depositing an insulating substance containing hydrogen ions not less than a preset value on the amorphous metal oxide semiconductor film.

For example, in order that the deposited insulating substance can convert the amorphous metal oxide semiconductor film under it into a conductor, the range of preset value for contained hydrogen ions may be a mass percent of 1%-2.5%.

By depositing an insulating substance containing hydrogen ions not less than a preset value on the amorphous metal oxide semiconductor film, it is possible to bring hydrogen ions in contact with the amorphous metal oxide and diffuse into the amorphous metal oxide, thereby converting the amorphous metal oxide semiconductor into a conductor.

Depositing of an insulating substance containing hydrogen ions not less than a preset value is conducted for example by introducing a mixed gas containing hydrogen gas not less than 20% while depositing the silicon nitride.

Introducing of a mixed gas containing hydrogen gas not less than 20% while depositing silicon nitride may convert silicon nitride into doped silicon nitride containing high quantity of hydrogen ions ($SiN_x:H$).

For example, a plasma enhanced chemical vapor deposition (PECVD) equipment can be used to deposit the abovementioned insulating layer film. For example, conditions for deposition may be: introducing a mixed gas of silicane $SiH_4$ (900-1600 sccm), ammonia $NH_3$ (2000-5000 sccm), nitrogen $N_2$ (10000-14000 sccm), and hydrogen $H_2$ (7000-20000 sccm), with a pressure range of 800-1700 mT, an equipment power range of 5000-6000 W, and a temperature fluctuation range of 290-300° C. SiNx:H is selected in this embodiment, because the binding ability of Si—O bond is stronger than that of Si—N bond, forming less unsaturated bonds, it is relatively difficult to form SiOx:H.

Of course, those skilled in the art may also convert the amorphous metal oxide semiconductor into a conductor by depositing an insulating substance containing hydrogen ions not less than a preset value in other feasible ways. For example, hydrogen ions are injected into the amorphous metal oxide semiconductor in the regions corresponding to the source electrode and drain electrode. For example, in the step shown in FIG. 3a, photoresist is used to protect the channel active layer. Hydrogen treatment may be carried out before depositing the insulating layer by means of for example a PECVD equipment, and this point, at this point only hydrogen gas is introduced to, by ionizing, form hydrogen ions that treat the exposed source electrode and drain electrode to enhance injection of hydrogen ions. As another example, in the step shown in FIG. 3d, post treatment is carried out again after depositing of the insulating layer, namely only hydrogen is introduced to, by ionizing, form hydrogen ions for treating the entire insulating layer to enhance injection of hydrogen ions. Or, plasma containing hydrogen ions is used to treat the amorphous metal oxide semiconductor in the regions corresponding to the source electrode and the drain electrode, which will not be described here.

Thin film transistors may include top gate electrode structure of thin film transistors and bottom gate electrode structure of thin film transistors. With a top gate electrode structure of thin film transistor as an example, an embodiment of the present invention provides a method of manufacturing a source electrode 201 and a drain electrode 202 by depositing silicon nitride that is hydrogen treated by a mixed gas containing hydrogen gas not less than 20% on the metal oxide as following.

S301. Coating photoresist on the amorphous metal oxide semiconductor film deposited on a substrate. The substrate is for example a glass substrate or a plastic substrate.

S302. Removing photoresist on parts of the amorphous metal oxide semiconductor film that are to be the source electrode and drain electrode.

Figure 3A:
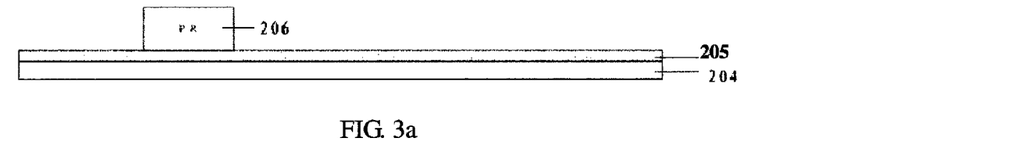
FIG. 3a is a structural view of photoresist deposited on an amorphous oxide film provided in an embodiment of the present invention.

For example, as shown in FIG. 3a, photoresist 206 on parts of the amorphous metal oxide semiconductor film 205 to be the source electrode and drain electrode 202 is removed. Remaining photoresist 206 corresponds to parts of the active layer 203 of the thin film transistor to be formed.

S303. Introducing a mixed gas containing hydrogen gas not less than 20% while depositing the silicon nitride layer.

Figure 3B:
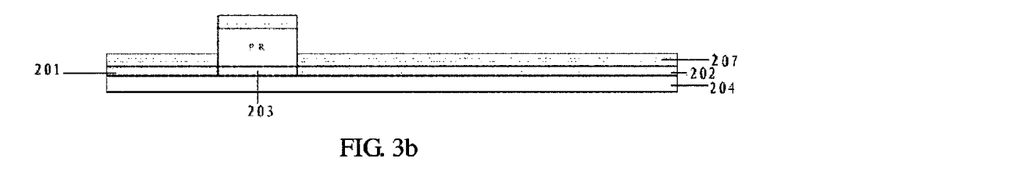
FIG. 3b is a structural view of a silicon nitride film subjected to a hydrogen treatment with a mixed gas with not less than 20% of hydrogen gas provided in an embodiment of the present invention.

For example, as shown in FIG. 3b, by introducing a mixed gas containing hydrogen gas not less than 20% while introducing gases to deposit the silicon nitride layer 207 on the substrate, the resulted silicon nitride layer 207 covers the entire surface of the substrate including photoresist 206. The silicon nitride layer 207 is disconnected at edges of the remaining photoresist 206.

S304. Removing photoresist to obtain the source electrode 201, the drain electrode 202 of a conductor and an active layer 203 of an amorphous metal oxide semiconductor between the source electrode and the drain electrode.

Figure 3C:
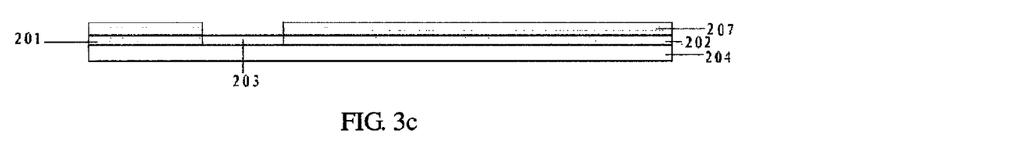
FIG. 3c is a structural view of a deposited passivation layer provided in an embodiment of the present invention.

For example, as shown in FIG. 3c, the photoresist 206 is removed, and at the same time the silicon nitride layer 207 remaining on the surface of photoresist 206 is removed, leaving the silicon nitride layer 207 containing hydrogen ions in the regions corresponding to the source electrode and drain electrode, and thus the source electrode 201 and drain electrode 202 of a conductor and an active layer 203 of an amorphous metal oxide semiconductor between the source electrode 201 and the drain electrode 202 is obtained.

Of course, those skilled in the art may also convert the amorphous metal oxide semiconductor into a conductor in another feasible way so long as the amorphous metal oxide semiconductor exhibits conductor characteristics.

For example, when the active layer 203 is an active layer of an amorphous metal oxide semiconductor, the source electrode 201 and the drain electrode 202 are the source electrode and the drain electrode made of the conductor converted from the amorphous metal oxide semiconductor; since the amorphous metal oxide semiconductor is transparent by itself, as for a thin film transistor, on the drain electrode of which a photodiode (PIN) is required to provide, such as one used in the amorphous silicon flat detection substrate, when light signals are incident on the PIN, part of the light will pass through the transparent drain electrode, leading to reduced conversion efficiency for the PIN to convert light signals into electrical signals. Here, it is possible to dispose a light shielding layer on the drain electrode 202 and the material for the light shielding layer may be a conductor that can reflect light, preferably, a metal. The PIN is disposed on the light shielding layer. The light shielding layer may function to reflect light, which is in favor of light absorption by the PIN, thereby allowing the amorphous silicon flat detection substrate to feedback effectively with respect to weak light signals, enhancing sensitivity of the amorphous silicon flat detection substrate and ensuring the device's detection accuracy.

For example, in manufacturing a silicon nitride layer containing hydrogen ions on an amorphous metal oxide semiconductor film by introducing a mixed gas containing hydrogen gas not less than 20% while depositing silicon nitride, it is preferable to configure the thin film transistor in a top gate electrode structure. Thus in the manufacturing process, the source electrode and the drain electrode are manufactured firstly, which can guarantee the consistent thickness of the metal oxide film deposited before the source electrode and the drain electrode are formed and the level surface of the metal oxide film. Further, depositing the silicon nitride containing hydrogen ions onto the amorphous metal oxide semiconductor film by introducing a mixed gas containing hydrogen gas not less than 20% while depositing the silicon nitride can ensure that parts of the amorphous metal oxide semiconductor film that serve as the source electrode 201 and the drain electrode 202 can be completely converted into a conductor, hence improving the yield of products.

For example, an embodiment of the present invention provides a thin film transistor structure in which the active layer 203 is of an amorphous metal oxide semiconductor, the source electrode 201 and the drain electrode 202 are of a conductor obtained by depositing silicon nitride on the amorphous metal oxide semiconductor film.

Figure 4:
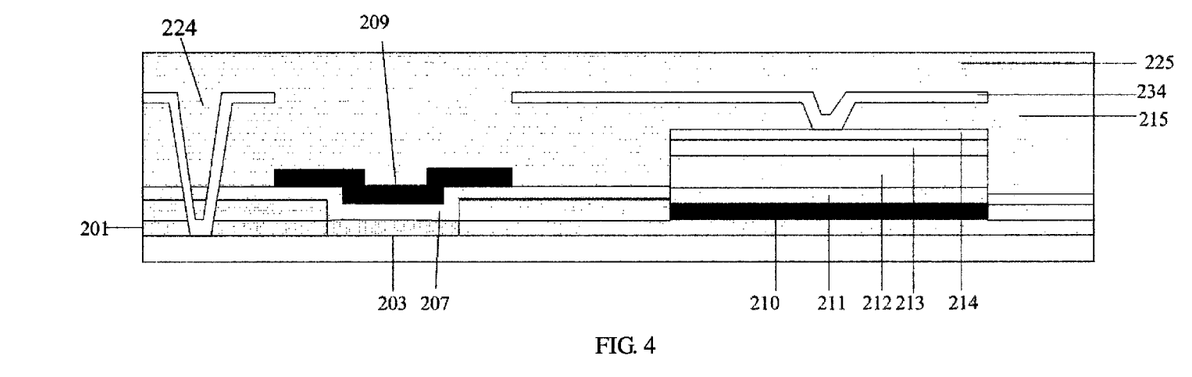
FIG. 4 is a second structural view of the thin film transistor provided in embodiments of the present invention.

For example, as shown in FIG. 4, the thin film transistor includes: a glass substrate 204, a source electrode 201 and a drain electrode 202 disposed on the glass substrate 204, and an active layer 203 between the source electrode 201 and the drain electrode 202. The active layer 203 is of an amorphous metal oxide semiconductor, the source electrode 201 and the drain electrode 202 are of a conductor converted from the amorphous metal oxide semiconductor film. The thin film transistor further includes: a silicon nitride layer 207 deposited on the source electrode 201 and the drain electrode 202, a silicon dioxide passivation layer 208 formed on the active layer 203 and the silicon nitride layer 207, a gate electrode 209 disposed on the silicon dioxide passivation layer 208 over the active layer 203, a light shielding layer 210 disposed on the drain electrode 202, and a PIN junction, formed by a stack of P-type silicon 211, intrinsic silicon 212 and N-type silicon 213, on the light shielding layer 210, and an electrode 214 disposed on the N-type silicon 213 of the PIN junction, an insulating layer 215 disposed on the electrode 214, the gate electrode 209, the source electrode 201 and the drain electrode 202, a pixel electrode 224 and a reverse biasing voltage cathode 234 disposed on the insulating layer 215, and a resin passivation layer 225 deposited on the pixel electrode 224 and the reverse biasing voltage cathode 234. The pixel electrode 224 and the reverse biasing voltage cathode 234 are electrically connected with the electrode 214 and the source electrode 107 respectively through vias formed in the insulating layer 215, and the resin passivation layer 225 is adapted to protect the entire device.

The PIN junction is located between the drain electrode 202 (anode) and the reverse biasing voltage cathode 234 of the thin film transistor. When a suitable reverse biasing voltage is applied across the electrodes at both ends, the intrinsic semiconductor layer in the PIN junction is easily depleted, namely an effective collecting area for carriers is enlarged, which means the light induced current is also increased. Pixel electrodes 224 correspond to pixels of the detector and function to establish an electric field to start rotation of liquid crystal molecules, thereby forming visible pictures.

An embodiment of the present invention provides a manufacturing method of a thin film transistor including the following steps.

S501. Providing an amorphous metal oxide semiconductor film on a substrate or on a gate electrode insulating layer on a gate electrode.

S502. Depositing an insulating substance containing hydrogen ions not less than a preset value in parts of the amorphous metal oxide semiconductor film serving as source electrode and drain electrode.

Since an amorphous metal oxide semiconductor has excellent performance such as high mobility, low pressure valve rate, small current and low temperature manufacturing, it is suitable for the active layer 203. The amorphous characteristics of the amorphous metal oxide semiconductor means lots of defect states in the semiconductor. When vast hydrogen ions contact the amorphous metal oxide, hydrogen ions can diffuse into the amorphous metal oxide and fill in the amorphous metal oxide as carriers due to the defect states of the amorphous metal oxide, which can convert the amorphous metal oxide semiconductor into a conductor.

Since the material for source electrode 201 and drain electrode 202 is the conductor converted from the material for forming the active layer 203, the valence band level difference is small compared with the active layer 203, and the lattice matching is good. Therefore, the heterojunction or homojunction formed between the source electrode 201 and the drain electrode 202 and the active layer 203 less influence the driving current signal, which improves the interface contact, and reduces influence on the thin film transistor's electricity characteristics by the valence band level difference between source, drain electrode and the active layer.

For a thin film transistor in a top gate electrode structure, Step s501 comprises disposing an active film on the substrate, and for a thin film transistor in a bottom structure, Step S501 comprises disposing an active film on a gate electrode insulating layer on the gate electrode.

For example, an embodiment of the present invention provides a method of depositing an insulating substance containing hydrogen ions not less than a preset value on parts of the amorphous metal oxide semiconductor film serving as the source electrode and drain electrode, including: coating photoresist on the amorphous metal oxide semiconductor film, removing photoresist on parts of the amorphous metal oxide semiconductor film that serves as the source electrode and the drain electrode, and then depositing an insulating substance containing hydrogen ions not less than a preset value on the amorphous metal oxide semiconductor film.

By depositing an insulating substance containing hydrogen ions not less than a preset value on the amorphous metal oxide semiconductor film, it is possible to bring hydrogen ions in contact with the amorphous metal oxide and diffuse into the amorphous metal oxide, thereby converting the amorphous metal oxide semiconductor into a conductor.

Depositing an insulating substance containing hydrogen not less than a preset value is for example introducing a mixed gas containing hydrogen gas not less than 20% while depositing the silicon nitride.

Introducing a mixed gas containing hydrogen gas not less than 20% while depositing silicon nitride may convert silicon nitride into doped silicon nitride containing high quantity of hydrogen ions (SiNx:H).

Of course, those skilled in the art may also convert the amorphous metal oxide semiconductor into a conductor by depositing an insulating substance containing hydrogen ions not less than a preset value in other feasible ways, which will not be described in detail here.

For example, an embodiment of the present invention provides a method of forming a source electrode 201 and a drain electrode 202 on amorphous metal oxide semiconductor by introducing a mixed gas containing hydrogen gas not less than 20% while depositing silicon nitride, including the following steps.

S301. Coating photoresist on the amorphous metal oxide semiconductor film deposited on a glass substrate.

S302. Removing photoresist on parts of the amorphous metal oxide semiconductor film that are to be the source electrode and drain electrode. For example, as shown in FIG. 3a, removing photoresist 206 on parts of the amorphous metal oxide semiconductor film 205 to be the source electrode and drain electrode 202 parts.

s303. Introducing a mixed gas containing hydrogen gas not less than 20% while depositing the silicon nitride. For example, as shown in FIG. 3b, a mixed gas containing hydrogen gas not less than 20% is introduced while the silicon nitride 207 is deposited.

S304. Removing photoresist to obtain the source electrode 201, the drain electrode 202 of the conductor and an active layer 203 of the amorphous metal oxide semiconductor between the source electrode and the drain electrode. For example, as shown in FIG. 3c, photoresist is removed and the source electrode 201, the drain electrode 202 of the conductor and an active layer 203 of amorphous metal oxide semiconductor between the source electrode and drain electrode are obtained.

Of course, those skilled in the art may also convert the amorphous metal oxide semiconductor into a conductor by depositing an insulating substance containing hydrogen ions not less than a preset value in other feasible ways, so long as the amorphous metal oxide semiconductor exhibits conductor characteristics.

An embodiment of the present invention provides an amorphous silicon flat detection substrate including the thin film transistor provided in an embodiment of the present invention.

For example, for an amorphous silicon flat detection substrate in which the used thin film transistor requires a PIN provided on the drain electrode, where the active layer 203 is an active layer of an amorphous metal oxide semiconductor, the source electrode 201 and the drain electrode 202 are the source electrode and the drain electrode made of a conductor converted from the amorphous metal oxide semiconductor; since the amorphous metal oxide semiconductor is transparent by itself, when light signals are incident on the PIN, part of the light will pass through the transparent drain electrode, leading to reduced conversion efficiency for the PIN to convert light signals into electrical signals. Here, it is possible to provide the light shielding layer 210 on the drain electrode 202 and provide the PIN junction on the light shielding layer 210. The light shielding layer 210 can function to reflect light, which is in favor of light absorption by the PIN junction, thereby allowing the amorphous silicon flat detection substrate to feedback effectively with respect to weak light signals, enhancing sensitivity of the amorphous silicon flat detection substrate and ensuring the device's detection accuracy.

An embodiment of the present invention provides a manufacturing method of amorphous silicon flat detection substrate including the manufacturing method of the thin film transistor provided in an embodiment of the present invention.

For example, in manufacturing the amorphous silicon flat detection substrate, the method further includes after step S502: forming a light shielding layer 210 on the drain electrode 202; and forming a PIN junction as photodiode on the light shielding layer 210.

Preferably, an embodiment of the present invention provides a manufacturing method of an amorphous silicon flat detection substrate in which the active layer 203 is of an amorphous metal oxide semiconductor, the source electrode 201 and the drain electrode 202 are of a conductor obtained from the amorphous metal oxide semiconductor as follows.

S601. Coating photoresist on the amorphous metal oxide semiconductor film deposited on e.g., a glass substrate.

S602. Removing photoresist on parts of the amorphous metal oxide semiconductor film that are to be the source electrode and drain electrode.

For example, as shown in FIG. 3a, removing photoresist 206 on parts of the amorphous metal oxide semiconductor film 205 to be the source electrode and drain electrode 202 parts. Remaining part of the photoresist 206 corresponds to the active layer 203 of the thin film transistor to be formed.

S603. Introducing a mixed gas containing hydrogen gas not less than 20% while depositing the silicon nitride.

For example, as shown in FIG. 3b, by introducing of a mixed gas containing hydrogen gas not less than 20% while introducing gases to deposit the silicon nitride layer 207 on the substrate, the resulted silicon nitride layer 207 covers the entire surface of the substrate including photoresist 206. The silicon nitride layer 207 is disconnected at edges of the remaining photoresist 206.

S604. Removing photoresist to obtain the source electrode 201, the drain electrode 202 of the conductor and an active layer 203 of amorphous metal oxide semiconductor between the source electrode and drain the electrode.

For example, as shown in FIG. 3c, the photoresist 206 is removed and at the same time the silicon nitride layer 207 remaining on the surface of photoresist 206 is removed as well, leaving the silicon nitride layer 207 containing hydrogen ions in the regions corresponding to the source electrode and the drain electrode, the source electrode 201 and the drain electrode 202 of a conductor and an active layer 203 of an amorphous metal oxide semiconductor between the source electrode 201 and the drain electrode 202 are obtained.

S605. Depositing a silicon dioxide passivation layer and removing silicon dioxide and silicon nitride at positions to form the photodiode to obtain vias preserved for the photodiodes.

Figure 3D:
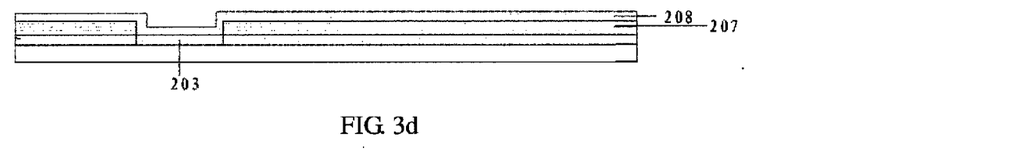
FIG. 3d is a structural view of a source electrode and a drain electrode as well as an active layer provided in an embodiment of the present invention.
Figure 3E:
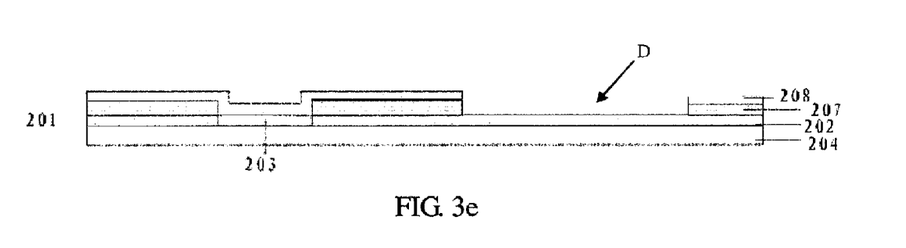
FIG. 3e is a diagram showing a structure of a passivation layer and a via on the drain electrode provided in an embodiment of the present invention.

For example, as shown in FIG. 3d, a silicon dioxide passivation layer 208 is deposited, as shown in FIG. 3e, the silicon dioxide layer 208 at the formation position of the photodiode is removed and at the same time a part of the silicon nitride layer 207 is removed to obtain a via D preserved for the photodiode.

S606. Depositing for example metal Mo (molybdenum) and obtaining the light shielding layer at the gate electrode and the via preserved for photo-diode by etching.

Figure 3F:
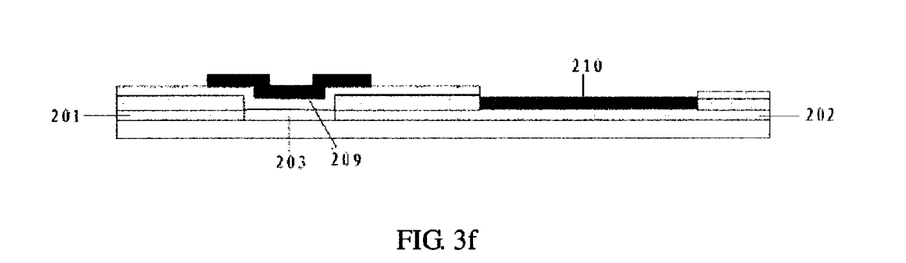
FIG. 3f is a diagram showing a structure of a gate electrode and a light shielding layer provided in an embodiment of the present invention.

For example, as shown in FIG. 3f, metal Mo is deposited and the light shielding layer 210 at the gate electrode 209 and at via preserved for photodiode is obtained by etching.

S607. Sequentially depositing P-type silicon, intrinsic silicon and N-type silicon, then sputtering with a sputtering equipment to obtain a pixel electrode film, wet-etching the pixel electrode film and then dry-etching the multilayer amorphous silicon to obtain the photodiode.

Figure 3G:
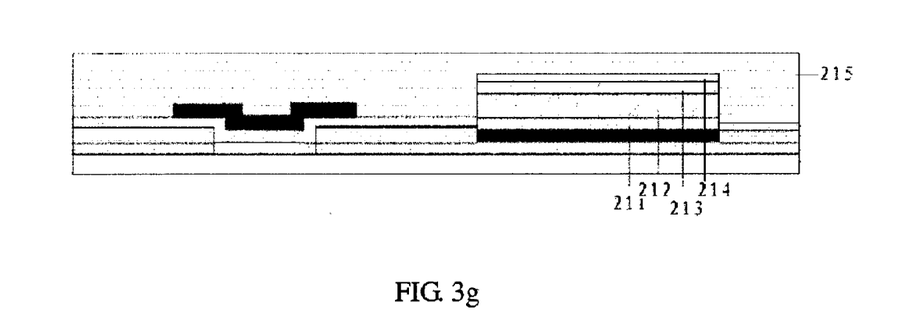
FIG. 3g is a structural view of a photodiode provided in an embodiment of the present invention.

For example, as shown in FIG. 3g, P-type silicon 211, intrinsic silicon 212, N-type silicon 213 are sequentially deposited, an electrode thin film 214 is obtained by sputtering with a sputtering equipment, firstly the electrode film 214 is wet-etched and then the multilayer amorphous silicon is dry-etched, obtaining the photodiode.

S608. Coating a resin layer as the passivation layer and dry-etching the passivation layer to obtain a via preserved for the pixel electrode.

Figure 3H:
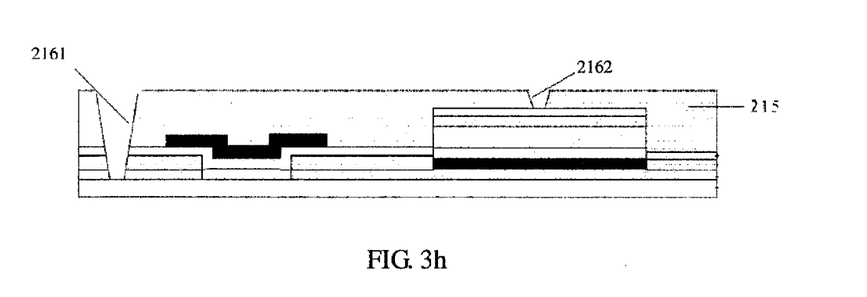
FIG. 3h is a diagram showing a structure of a passivation layer and a via on the photodiode provided in an embodiment of the present invention.

For example, as shown in FIG. 3h, a passivation layer 215 is formed and preserved vias 216 leading to the source electrode 107 and the electrode 214 are formed in the passivation layer 215.

S609. Depositing a pixel electrode film and wet-etching the film to obtain a pixel electrode.

Figure 3I:
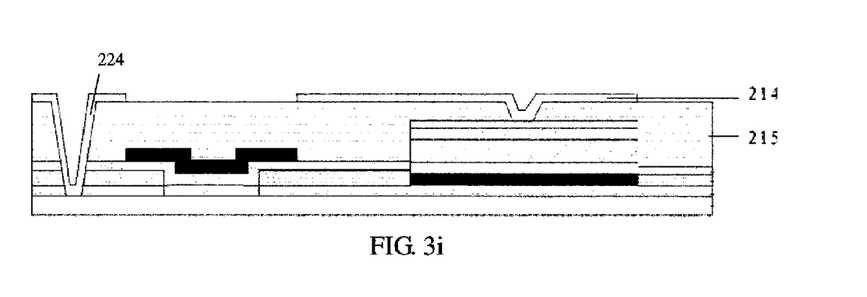
FIG. 3i is a structural view of a pixel electrode provided in an embodiment of the present invention.

For example, as shown in FIG. 3i, a pixel electrode film is deposited on the substrate and a pixel electrode 224 and a reverse biasing voltage cathode 234 are obtained by wet etching, which are connected with the source electrode 107 and the electrode 214 respectively through the via 2161 and the via 2162.

S610. Forming a resin passivation layer. For example, as shown in FIG. 4, a resin passivation layer 225 is deposited, and a thin film transistor and a photodiode connected therewith are obtained.

Embodiments of the present invention provide a thin film transistor, an amorphous silicon flat detection substrate and a manufacturing method in which the material for the source electrode and the drain electrode of the thin film transistor is a conductor converted from the material of an amorphous metal oxide active layer by depositing an insulating substance containing hydrogen ions not less than a preset value, thereby reducing valence band level difference between source, drain electrode and the active layer, resulting in good lattice matching. The formed heterojunction or homojunction less influences the driving current signal, obstacles for electron flow are reduced, interface contact is improved, thereby reducing influence on thin film transistor's electricity characteristics by the valence band level difference between source, drain electrode and the active layer.

What are described above is related to the illustrative embodiments of the disclosure only and not limitative to the scope of the disclosure; the scopes of the disclosure are defined by the accompanying claims.

The invention claimed is:

1. A manufacturing method of a thin film transistor comprising:
    disposing an amorphous metal oxide semiconductor film on a substrate or on a gate electrode insulating layer on a gate electrode; and
    depositing an insulating substance containing hydrogen ions not less than a preset value of a mass percent of 1% in parts of the amorphous metal oxide semiconductor film serving as a source electrode and a drain electrode.

2. The method of claim 1, wherein the amorphous metal oxide semiconductor film is an indium gallium zinc oxide semiconductor film, an indium tin oxide semiconductor film, or an indium zinc oxide semiconductor film.

3. The method of claim 1, wherein depositing an insulating substance containing hydrogen ions not less than a preset value comprises:
    coating photoresist on the amorphous metal oxide semiconductor film, removing photoresist on parts of the amorphous metal oxide semiconductor film serving as the source electrode and the drain electrode, and depositing an insulating substance containing hydrogen ions not less than a preset value on the amorphous metal oxide semiconductor film.

4. The method of claim 1, wherein depositing an insulating substance containing hydrogen ions not less than a preset value comprises introducing a mixed gas containing hydrogen gas not less than 20% while depositing silicon nitride.

5. A thin film transistor comprising: a source electrode, a drain electrode, and an active layer connecting the source electrode and the drain electrode,
    wherein the active layer is an amorphous metal oxide semiconductor layer; a material for the source electrode and the drain electrode is a conductor converted from a material for manufacturing the active layer by depositing an insulating substance containing hydrogen ions not less than a preset value of a mass percent of 1%.

6. The thin film transistor of claim 5, wherein the amorphous metal oxide semiconductor layer is an indium gallium zinc oxide semiconductor layer, an indium tin oxide semiconductor layer, or an indium zinc oxide semiconductor layer.

7. The thin film transistor of claim 5, wherein depositing an insulating substance containing hydrogen ions not less than a preset value comprises: introducing a mixed gas containing hydrogen gas not less than 20% while depositing silicon nitride.

8. The thin film transistor of claim 5, wherein the thin film transistor is a top gate electrode structure.

9. An amorphous silicon flat detection substrate comprising the thin film transistor of claim 5.

10. The amorphous silicon flat detection substrate of claim 9, further comprising:
    a light shielding layer disposed on the drain electrode; and
    a photodiode disposed on the light shielding layer.

11. The method of claim 2, wherein depositing an insulating substance containing hydrogen ions not less than a preset value comprises introducing a mixed gas containing hydrogen gas not less than 20% while depositing silicon nitride.

12. The method of claim 3, wherein depositing an insulating substance containing hydrogen ions not less than a preset value comprises introducing a mixed gas containing hydrogen gas not less than 20% while depositing silicon nitride.

13. The method of claim 2, wherein depositing an insulating substance containing hydrogen ions not less than a preset value comprises:
    coating photoresist on the amorphous metal oxide semiconductor film, removing photoresist on parts of the amorphous metal oxide semiconductor film serving as the source electrode and the drain electrode, and depositing an insulating substance containing hydrogen ions not less than a preset value on the amorphous metal oxide semiconductor film.

14. The method of claim 13, wherein depositing an insulating substance containing hydrogen ions not less than a preset value comprises introducing a mixed gas containing hydrogen gas not less than 20% while depositing silicon nitride.

15. The thin film transistor of claim 6, wherein the thin film transistor is a top gate electrode structure.

16. The thin film transistor of claim 7, wherein the thin film transistor is a top gate electrode structure.

17. A manufacturing method of an amorphous silicon flat detection substrate, comprising:
    forming a thin film transistor with the manufacturing method of the thin film transistor of claim 1; and
    forming a photodiode.

18. The method of claim 17, wherein after converting parts of the amorphous metal oxide semiconductor film serving as the source electrode and the drain electrode into a conductor by depositing an insulating substance containing hydrogen ions not less than a preset value, a light shielding layer is manufactured on the drain electrode, and the photodiode is manufactured on the light shielding layer.

19. The method of claim 1, wherein the preset value is a mass percent of 2.5%.

* * * * *